United States Patent [19]

Ruane

[11] Patent Number: 4,918,812
[45] Date of Patent: Apr. 24, 1990

[54] PROCESSING OF CORES FOR CIRCUIT BOARDS OR CARDS

[75] Inventor: Robert E. Ruane, Endicott, N.Y.

[73] Assignee: International Business Machines Corporation, Armonk, N.Y.

[21] Appl. No.: 213,944

[22] Filed: Jun. 29, 1988

[51] Int. Cl.$^5$ ............................................. H05K 3/10
[52] U.S. Cl. ........................................ 29/846; 29/848; 29/424; 156/306.9; 156/307.5
[58] Field of Search ........................ 29/846, 848, 424; 156/306.9, 307.5, 307.7, 344

[56] References Cited

U.S. PATENT DOCUMENTS

| 4,191,800 | 3/1980 | Holtzman | 29/846 |
| 4,201,616 | 5/1980 | Chellis | 156/307.7 |
| 4,606,787 | 8/1986 | Pelligrino | 29/848 |
| 4,649,497 | 3/1987 | Carlson et al. | 29/846 |

FOREIGN PATENT DOCUMENTS

| 0059854 | 5/1977 | Japan | 29/848 |
| 0034142 | 10/1979 | Japan | 29/846 |
| 1224497 | 10/1986 | Japan | 156/307.7 |
| 2056141 | 3/1987 | Japan | 156/306.9 |

Primary Examiner—P. W. Echols
Assistant Examiner—K. Jordan
Attorney, Agent, or Firm—Pollock, Vande Sande & Priddy

[57] ABSTRACT

Two cores for circuit boards or cards are simultaneously processed.

In particular, two cores are provided wherein each is a dielectric material having conductive planes on both major surfaces thereof. The two cores are temporarily fixed together by sealing the peripheral face planes thereof.

The two external conductive planes are then simultaneously processed to thereby form signal patterns.

The seal is then removed from the peripheral face planes and the two cores are separated from each other, thereby simultaneously providing the two cores.

7 Claims, 1 Drawing Sheet

PROCESSING OF CORES FOR CIRCUIT BOARDS OR CARDS

DESCRIPTION

TECHNICAL FIELD

The present invention is concerned with processing cores for circuit boards or cards.

In particular, the present invention is concerned with simultaneously processing two cores which involves temporarily bonding them together around the peripheral face planes for processing and then separating them when simultaneous processing is completed.

The process of the present invention is especially advantageous for producing relatively thin cores for circuit boards or cards.

The process of the present invention permits the handling of relatively thin cores on the high volume equipment that is commercially employed.

BACKGROUND ART

In the processing of circuit boards and cards, the relative thickness required for high volume manufacture employing various commercially available equipment has been a major limiting factor.

For instance, the thickness of the core for circuit boards and cards for various high volume processing has been in the order of about 12 mils or greater.

The cores contain a signal pattern on one side and a blank uncircuitized metallic layer on the other side which can later be made into the external composite surface.

One of the inefficient aspects of the current process employed is that both sides or major surfaces of the core must be processed through all of the photoprocessing and finishing operations, even though such is only required on the signal pattern side.

For instance, the metal, such as the copper on the side which is to function as the blank uncircuitized layer during the photoprocessing, will be entirely covered by a photosensitive material which will remain as such during the photoprocessing, and then be removed in its entirety. As apparent, this is highly wasteful of photoresist material.

SUMMARY OF THE INVENTION

The process of the present invention overcomes the above-discussed problems with respect to the prior art.

In particular, the process of the present invention allows for the handling of relatively thin cores on the high volume equipment used in prior processes that have required cores of much greater thickness, such as about 12 mils or more.

Also, by following the process of the present invention, the inherent in efficiency whereby both sides of the core are necessarily processed through all of the photoprocessing and finishing operations is eliminated.

In particular, the process of the present invention includes providing two cores, each being a dielectric material having conductive planes on both major surfaces thereof. The two cores are temporarily bonded or fixed together by sealing the peripheral face planes providing two internal adjacent conductive planes and two external conductive planes. The two external conductive planes are simultaneously processed to thereby form signal patterns thereon. The seal from the peripheral face planes is then removed and the cores are separated from each other, thereby simultaneously providing the two cores, each having one signal plane and one uncircuitized metal layer thereon.

BEST AND VARIOUS MODES FOR CARRYING OUT THE INVENTION

Figure 1:
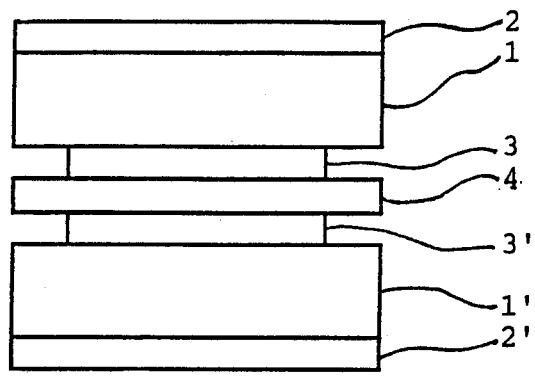
FIGS. 1-3 are schematic illustrations exemplifying the method of the present invention.

The present invention is concerned with producing cores for circuit boards or cards whereby two cores are simultaneously processed.

The process of the present invention includes providing two cores, each being a dielectric material having conductive planes on both major surfaces thereof.

The dielectric materials employed include thermoplastic and thermosetting resins.

Typical thermosetting resinous materials include epoxy, phenolic-based materials, and polyamides. Such materials are usually molded of the resinous material, along with a reinforcing agent such as being a glass-filled epoxy or phenolic-based material.

Examples of some phenolic-type materials include copolymers of phenol, resorcinol, and cresol.

Examples of some suitable thermoplastic polymeric materials include polyolefins such as polypropylene, polysulfones, polycarbonates, nitrile rubbers, and ABS polymers.

The preferred polymeric materials employed in accordance with the present invention are epoxy resinous materials.

Typical epoxy resins include the bisphenol A type resins obtained from bisphenol A and epichlorohydrin; brominated bisphenol A type resins from tetrabrominated bisphenol A and epichlorohydrin; resinous materials obtained by the epoxidation of novolak resins produced from a phenolic material such as phenol and an aldehyde such as formaldehyde with epichlorohydrin; epoxidized non-linear novolaks having at least about six terminal epoxy groups such as EPI-REZ SU8; polyfunctional epoxy resins such as tetraglycidyl-diaminodiphenyl methane and alicyclic epoxy resins such as bis(3,4-epoxy-6-methyl-cyclohexyl methyl) adipate.

The epoxy resinous compositions also can contain accelerating agents and curing agents as well-known in the art.

Examples of suitable curing agents include polyamines, primary, secondary, and tertiary amines, polyamides, polysulfides, dicyanamide, urea-phenol-formaldehyde, and acids or anhydrides thereof. In addition, suitable curing agents include Lewis acid catalysts such as $BF_3$ and complexes thereof.

The preferred epoxy compositions are those disclosed in U.S. Pat. No. 3,523,037 to Chellis, disclosure of which is incorporated herein by reference.

Many of the dielectric substrates employed pursuant to the present invention are referred to as so-called prepreg substrates which contain a resin and a reinforcing fabric such as fiberglass. Such compositions containing fabric are usually prepared by impregnating the fabric with, for example, an epoxy polymer composition. The amount of epoxy composition is usually about 30% to about 70% by weight and preferably about 50% to about 65% by weight of the total solids content of the epoxy composition in the fiberglass.

A particular glass fabric employed in accordance with the present invention has a single ply thickness of about 1.5 mil and is a woven glass, a typical one being 106 style woven glass fabric. Other typical glass fabrics range, for instance, from style 104 (1.2 mils single ply thickness) to style 141 (11 mils single ply thickness).

After combining the fabric with the resinous material, the composition is cured to the B-stage and cut to the desired shape, such as a sheet. When sheets are employed, the single ply thickness is usually about 1.4 mils for 104 style glass to about 8 mils. However, thicker sheets can be employed if desired. For 106 style woven glass fabric, the single ply thickness is about 1.8 mils thick. A typical multi-ply thickness employed pursuant to the present invention of a core is about 5 mils. The curing to the B-stage is usually achieved by using temperatures of about 80° C. to about 110° C. for about 3-10 minutes.

The now-impregnated fabric or prepreg can be divided into sheets of desired size, typical of which for the present invention is about 24×28 inches which is somewhat larger than the desired final product which is about 20.5×25 inches.

The number of individual sheets of prepreg to provide any given core can vary greatly, such as from 1 to about 20 or more, depending upon the desired final product, among other factors. Typically, about 2 or 3 sheets of the prepreg are interleaved between sheets of electrolytic copper foil placed between two polished metal plates. This assembly of prepregs and metal plates and copper foil is then placed between platens of a laminating press. The platens are cored for steam or super-heated water so that they can be heated to elevated temperatures.

The above assembly is subjected to pressures which may vary from about 50 psi to about 2000 psi, depending upon the resin content, flow of the prepreg and laminate temperatures. Preferably, the pressures are about 300 psi to about 500 psi. The laminate temperature is preferably about 300° F. to about 400° F., typically about 350° F. The time of the pressing operation is variable depending upon the particular materials employed and the pressure applied. About 1 hour is adequate for the above conditions. According to preferred aspects of the present invention, the laminate is cooled down to room temperature in about 1 hour by introducing cool water into the platens of the laminating press.

A typical copper foil employed on the surface that is to provide the signal patterns is referred to as one-ounce copper, which means that it is about 1 ounce per square foot and is about 36 microns thick. A typical copper foil employed on the surface for the subsequent uncircuitized plane is ½ ounce per square foot and is about 18 microns thick. Of course, other foils can be used on either surfaces if desired, such as 1 ounce on the surfaces to provide the subsequent uncircuitized planes.

In accordance with the preferred aspect of the present invention, one of the copper foils will be sized so that it is smaller than the copper foil on the opposite side of the dielectric substrate.

Next, according to the preferred aspects of the present invention, the two cores have one of their major surfaces abutting the major surface of the other core such that the internal adjacent conductive planes are shorter than the external conductive planes (see FIG. 1).

Although it is not essential to have the internal adjacent conductive planes shorter than the external conductive planes (especially when an adhesive sheet discussed below is present), it is preferred to do so in order to ensure that the subsequent bonding between the two cores is adequate to maintain the cores together during the subsequent processing. In particular, the presence of copper at the intermediate sections of the composite two core arrangement reduces the adhesion.

In a typical arrangement, the copper on the inside need only be about 0.25 of an inch from the edges of the dielectric. However, it must be larger than the final dimensions of the core which, for a typical core, will be about 20.5 inches ×25 inches. In a typical arrangement, the copper on the internal planes is about 23 inches ×27 inches for a dielectric of about 24 inches ×28 inches.

In addition, in order to assure that the internal faces are maintained in their relative positions during the processing, a dual-sided adhesive sheet could be placed between the internal planes at lamination. These sheets could then be readily removed at the time of separation of the two cores, such as by employing a simple, properly sized pneumatic tool having double piano-like wires to separate the adhesive sheet from the internal metal such as copper planes.

Such will also be helpful to build up the total thickness of the dual core configuration for the processing. This would be especially important in the event the thickness of the dual core arrangement is not sufficient for processing using a particular piece of equipment.

A preferred material for this purpose is a laminated prepreg of the same type as used for the prepreg of the core. A typical laminate has about four (4) plies of the prepreg. It is prelaminated to the dimensions of the cores during processing (e.g. - 24×28 inches). Such is prepared by laminating about 4 plies of prepreg interleaved between sheets of a smooth plastic such as Tedlar (a trade designation of Du Pont) placed between two polished metal plates.

The two cores are then temporarily fixed together by sealing the peripheral face planes thereof. In particular, the peripheral face planes can be sealed by employing, for example, an epoxy composition such as the same type of epoxy composition as used to form the prepregs in the preferred procedure discussed hereinabove. The two individual cores can be individually prelaminated or, in the case of the presence of the intermediate sheet, the two cores can be produced by simultaneous lamination in the same laminating press with the intermediate sheet located between the plies for the individual cores. The intermediate sheet separates the plies for one core from the plies for the other core.

The two external conductive planes are then simultaneously processed to thereby form signal patterns on both of the cores. After completion of the test and finishing operations, the core-set can then be profiled to the final core dimensions such as employing a conventional milling machine. The milling operation will, in turn, also remove the sealing material at the peripheral face planes of the cores, thereby making it possible to separate the cores from each other and thereby obtain two separate cores, each having one signal plane and one uncircuitized plane. The internal planes were protected during the processing from the developing compositions and thereby did not require coating with any photoresist as required by prior art processes.

Since the process of the present invention makes it possible to provide signal cores that are considered extremely thin, improvement in external wireability is likewise obtained.

It is apparent as discussed above that the present invention is applicable to dielectrics in general and not limited merely to the epoxy-glass dielectrics.

Figure 2:
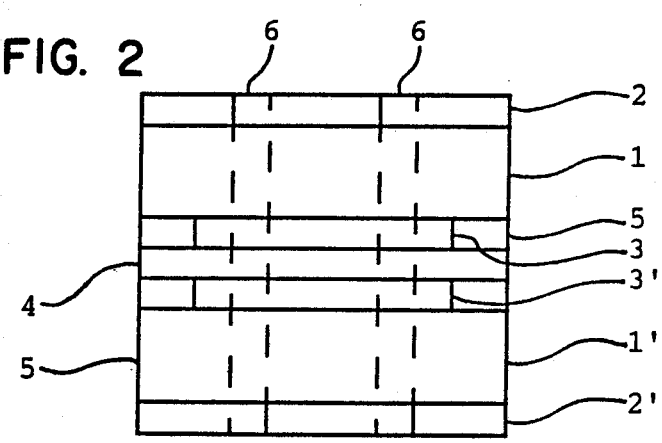
Figure 3:
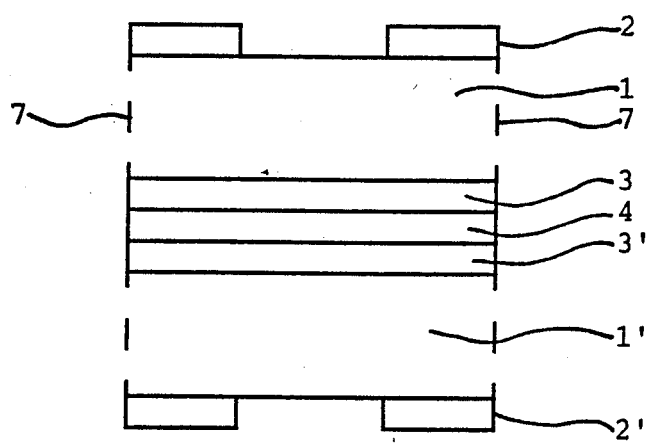

To further facilitate understanding the present invention, reference is made to FIGS. 1-3.

In FIG. 1 the dual core set is illustrated by two dielectric materials (1,1') having an external conductive plane (2,2', respectively) and an internal conductive plane (3,3', respectively) which preferably is shorter than the external conductive plane.

Intermediate between the two conductive materials and internal adjacent conductive planes is an adhesive sheet (4).

FIG. 2 illustrates the temporarily bonding together by sealing the peripheral face planes with a sealant such as an epoxy composition (5).

If desired, tooling holes (6) can be provided to position the arrangement for the subsequent processing. However, these are not necessary.

FIG. 3 illustrates the profiling of the final core dimension as illustrated by dotted line (7) which, likewise, removes the sealant (5) from the peripheral face planes so that the two cores can be separated from each other. Likewise, the tooling holes are removed during the profiling procedure.

Having thus described our invention, what we claim as new and desire to secure by Letters Patent is:

1. A method for processing cores for circuit boards or cards which comprises:
   (a) providing two coresx, each being a dielectric material having conductive planes on both major surfaces thereof;
   (b) providing said two cores with internal conductive planes and external conductive planes wherein the internal conductive planes are smaller than the external conductive planes, but larger than the desired dimensions of the final core;
   (c) temporarily fixing together said two cores by placing between the internal conductive planes an adhesive sheet of prepreg dielectric and subsequently sealing the peripheral face planes;
   (d) simultaneously processing the two external conductive planes to thereby form signal patterns; and
   (e) removing said seal from the peripheral face planes and separating the cores from each other, thereby simultaneously providing said two cores, each having one signal plane and one uncircuitized plane.

2. The method of claim 1 whereby the seal is removed from the peripheral face planes by profiling the cores to the desired final core dimensions.

3. The method of claim 2 wherein the profiling is carried out by milling.

4. The method of claim 1 whereby the dielectric material is 2-3 sheets of prepreg, each sheet being about 1.8 mils thick.

5. The method of claim 4 wherein said prepreg is an epoxy-fiber glass prepreg.

6. The method of claim 1 wherein each core is a multiply laminate and is individually prelaminated.

7. The method of claim 1 wherein each core is a multiply laminate and wherein the two cores are produced by simultaneous lamination with the adhesive sheet located separating the plies for one core from the plies for the other core.

* * * * *